US007088833B1

(12) United States Patent
Kling

(10) Patent No.: US 7,088,833 B1
(45) Date of Patent: Aug. 8, 2006

(54) MULTIPLE-SPEAKER

(76) Inventor: Martin Kling, Jundersatrasse 14, 30179 Hannover (DE)

( * ) Notice: Subject to any disclaimer, the term of this patent is extended or adjusted under 35 U.S.C. 154(b) by 543 days.

(21) Appl. No.: 10/049,147

(22) PCT Filed: Sep. 28, 2000

(86) PCT No.: PCT/DE00/03378

§ 371 (c)(1),
(2), (4) Date: Feb. 8, 2002

(87) PCT Pub. No.: WO01/26412

PCT Pub. Date: Apr. 12, 2001

(30) Foreign Application Priority Data

Oct. 1, 1999 (DE) ................................ 199 47 178
Oct. 26, 1999 (DE) ................................ 199 51 406

(51) Int. Cl.
*H03G 5/00* (2006.01)
(52) U.S. Cl. ........................................... 381/97; 381/98
(58) Field of Classification Search .................. 381/97, 381/98, 99, 100, 61, 63, 17, 1, 101, 103
See application file for complete search history.

(56) References Cited

U.S. PATENT DOCUMENTS 4,349,698 A * 9/1982 Iwahara ......................... 381/1
4,797,933 A * 1/1989 Hahne ......................... 381/96
4,873,722 A * 10/1989 Tominari ....................... 381/17
4,999,522 A * 3/1991 Deville ....................... 327/231
5,033,092 A * 7/1991 Sadaie ......................... 381/97
5,121,433 A * 6/1992 Kendall et al. ................ 381/1
5,129,005 A * 7/1992 Zwicky et al. ................ 381/96
5,828,763 A * 10/1998 Koyano et al. ............... 381/97
6,631,193 B1 * 10/2003 Miller ......................... 381/98

* cited by examiner

*Primary Examiner*—Xu Mei
(74) *Attorney, Agent, or Firm*—Myron Greenspan; Lackenbach Siegel, LLP

(57) ABSTRACT

The invention relates to a loudspeaker combination comprised of at least two loudspeakers, of which one is preceded by a low-pass frequency filter, the other by a phase shifter in the form of an all-pass filter. The invention addresses the problem of providing with simple means a configuration simple of realization of such a loudspeaker combination, whose frequency response and whose radiation characteristic is significantly improved. The invention resides therein that the other loudspeaker or the other loudspeakers is/are each preceded by at least one phase shifter, with all phase shifters being tuned with respect to their phase setting to the phase position of the loudspeakers radiating lower tones, such that all loudspeakers radiate the low tones in like phase position. The fundamental idea is herein: several primarily identically structured loudspeakers can be employed, all or at least the major portion of the loudspeakers are allowed to transmit low tones, with the loudspeakers, which, in addition to the low frequencies, also have to transmit higher frequencies, being changed in their phase position such that the low and the particular lower frequencies are radiated in identical phase position. A large loudspeaker area therein transmits the low frequencies, a smaller the medium and high frequencies. This yields better transmission results than can be attained with loudspeakers laid out in their structural form for separated frequency ranges. Hereby the technical expenditures are low, the possibly attainable improvement of radiation characteristics, however, is remarkable.

10 Claims, 2 Drawing Sheets

MULTIPLE-SPEAKER

The invention relates to a loudspeaker combination comprising at least two loudspeakers of which one is preceded by a low-pass frequency filter and the other by a phase shifter.

Figure 2:
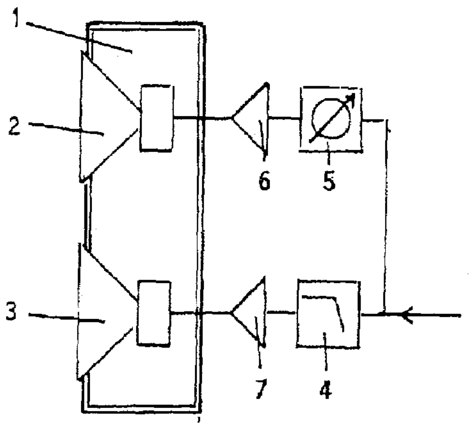

Such a loudspeaker combination is disclosed in DE 44 47 269 C1 FIG. 2. As is conventional in such loudspeaker combinations, the electric signals to be converted into acoustic signals are supplied to two loudspeakers, and the one loudspeaker is preceded by a low-pass filter, the other loudspeaker by a high-pass filter such that with the one loudspeaker the low frequencies are radiated, with the other loudspeaker the high frequencies. Since this form of frequency division and frequency separation is unsatisfadory, a phase shifter has been disposed between the high-pass filter and the treble loudspeaker, with which the phase position of the high-pitch signals is shifted by 180°. Herewith rectangular pulses are said to be reproduced satisfactorily, however, the transmission quality is unsatisfactory for music and voice transmission.

For sound transducers for the transmission of music and voice signals, in general requirements are made for specified sound pressure over wide frequency ranges, low intrinsic oscillations and low resonance, linear characteristics, a wide transmission range, low fabrication costs and, for application as insonation systems in events halls, public buildings etc., in addition the demand for uniform frequency-independent sound focusing and maximal settable radiation angle for various application purposes with minimum dimensions. While some of these requirements can be attained with present-day transducers and use of additional electronics, no transducer is known up to now which meets all of the above requirements to a satisfactory degree.

To solve the above problems, different approaches have been realized in the past: in general, for the consumer market systems are used in which the frequency band is divided onto several bands and these are assigned to several diaphragms of different sizes. Large and heavy diaphragms transmit the bass range, while smaller, lighter diaphragms transmit the higher frequency ranges. Based on this construction, the problem of different focusing factors, phase responses and group delays of the discrete systems leads to irregularities in the radiative and transmission behavior of the overall system in the filter transition band entailed therein. Moreover, due to interferences between the systems and outside of the main radiation axis irregularities occur in the degree of transmission.

Since loudspeakers of known structural type do not fulfill the requirements for high quality of voice and sound transmission, multiple attempts have been made to improve the transmission quality by combining loudspeakers of different and like structural type with and without preceding frequency filters. In the case of these constructions the problem also arises of differing focusing factors, phase responses and group delays of the discrete systems and entailed therein irregularities in the radiative and transmission behavior of the overall system in the filter transition band. Moreover, through interferences between the systems outside of the main radiation axis, irregularities results in the degree of transmission.

The invention avoids the disadvantages of prior art. The invention addresses the problem of providing with simple means a configuration simple of realization of such a loudspeaker combination, whose frequency response and whose radiation characteristic is significantly improved.

The invention comprises that from the (at least) two loudspeakers (at least) one radiates only low tones, (at least) another one low tones and at least tones of medium frequency, and that the phase shifter(s) in front of the loudspeakers radiating low tones as well as also at least medium frequency tones are set such that all phase shifters with respect to their phase setting are tuned to the phase position of the loudspeaker(s) radiating only lower tones. In this way, all loudspeakers radiate the low tones in like phase position, such that no interferences or similar phenomena occur.

By applying and combining these technical characteristics it is no longer necessary to utilize specifically very large and thereby also sluggish as well as expensive bass loudspeakers with diaphragms of great weight in order to attain good sound quality in the bass range, rather, it is possible to employ several identically structured loudspeakers of a cost-effective implementation, which, due to their lighter diaphragms, respond faster in order to radiate with all of these the low tones, while the medium and high tone ranges are only radiated with a portion of the loudspeakers. A large loudspeaker area radiating in-phase transmits the low tones, while a smaller loudspeaker area radiates the medium and high frequency ranges. This yields better transmission results than those that can be achieved with loudspeaker combinations whose structural form is laid out for specific frequency ranges.

In order to be able to produce this loudspeaker combination highly cost-effectively, it is advantageous that at least one of the loudspeakers also radiating tones of the medium frequency range of this loudspeaker combination is of identical structural type and form as the loudspeaker which is preceded by the low-pass filter. In this way it is possible to utilize loudspeakers of industrial mass production and, apart from said technical advantages, also lead to economic advantages.

It is therein advantageous if all or at least several loudspeakers of this loudspeaker combination (without preceding filter and phase shifter) have identical or at least highly similar frequency characteristics.

The fundamental idea of the invention comprises employing several principally identically structured loudspeakers, allowing all or at least the major portion of the loudspeakers to radiate the low tones, wherein the loudspeakers, which, in addition to the low frequencies, also have to transmit relatively higher frequencies, are changed with respect to their phase position such that the low frequencies are radiated by all loudspeakers which radiate low frequencies, in the same phase position. A large loudspeaker area transmits low frequencies, a smaller one medium and high frequencies. This yields better transmission results than can be attained with loudspeakers structurally laid out for separated frequency ranges.

The fundamental form of the present invention resides therein that two identically structured loudspeakers are provided in the combination and that the loudspeaker without preceding low-pass filter is preceded by a phase shifter which, with respect to its phase setting, is tuned to the phase position of the bass loudspeaker.

Hereby the technical expenditures are low, the attainable improvement of the radiation characteristics, however, is remarkable. The phase setting can be carried out in simple manner. Thereby is attained ready adaptation to the particular space to be insonated. In spite of the low expenditures, voice audibility and music suitability are significantly improved. Focusing of the sound radiation, which is largely independent of frequency, is attained without pronounced secondary lobes. A highly homogeneous and low-interference radiative behavior is obtained.

With this loudspeaker combination the loudspeaker(s) connected to the low-pass filter and the loudspeaker(s) connected to the phase shifter can be identical or very similar in their structural type and size. This yields not only price advantages when purchasing relatively large quantities but also acoustic advantages of various types. Low tones are radiated from several loudspeakers in-phase, high tones only from a single loudspeaker or a few loudspeakers of identical radiation characteristic.

With this loudspeaker combination it is entirely possible and, for relatively large systems, recommended that several loudspeakers are connected to the low-pass filter and/or several loudspeakers to the phase shifter.

For greater sound powers and improved sound quality it is of advantage if a further loudspeaker in this combination is provided which is preceded by a low-pass filter, however with higher upper pass frequency, as well as also by a phase shifter, whose phase setting is tuned to the phase position of the bass loudspeaker, and that at least one treble loudspeaker with preceding high-pass filter is additionally provided in this loudspeaker combination.

It is useful if the all-pass filter is structured entirely of passive circuit elements. But the all-pass filter can also be structured of active and passive circuit elements.

It is further of advantage if the two identical or highly similar loudspeakers, of which the one is preceded by a low-pass filter, the other by a phase shifter, are jointly accommodated with a treble loudspeaker in a common housing.

The loudspeaker combination can also be a loudspeaker series, in which the loudspeakers are accommodated in a long housing and form a loudspeaker series.

In the case of a loudspeaker series it is of advantage if the bass loudspeakers are disposed at the ends or at the outsides of the loudspeaker series.

The essence of the invention will be explained in further detail in conjunction with embodiment examples depicted in the drawing schematically in block circuit diagrams.

Figure 1:
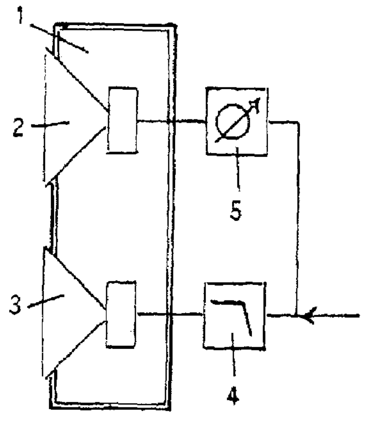
Figure 3:
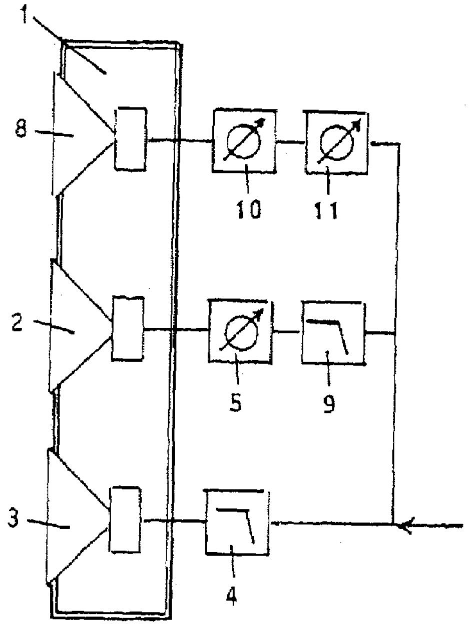
Figure 4:
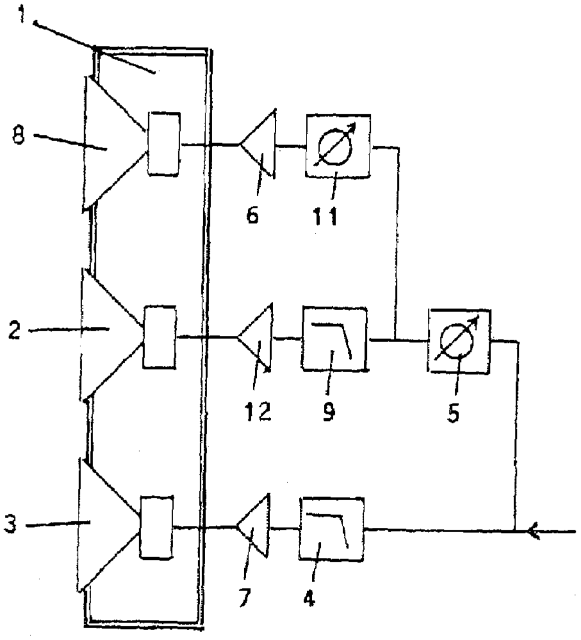
Figure 5:
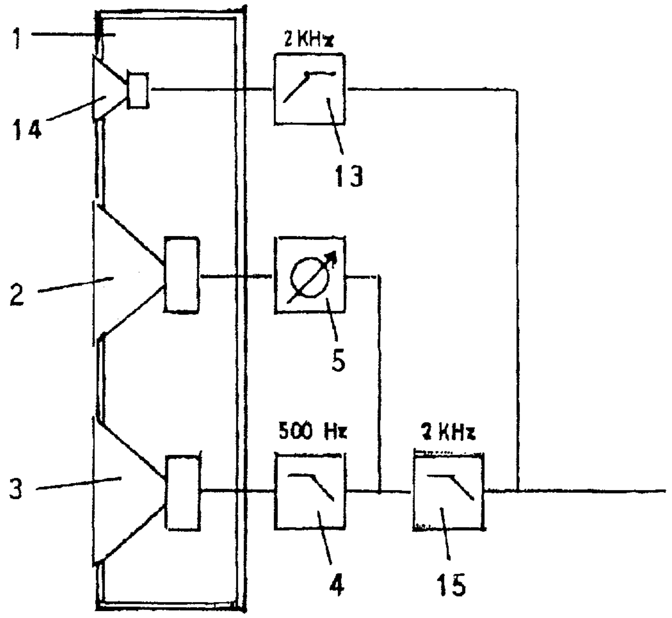
Figure 6:
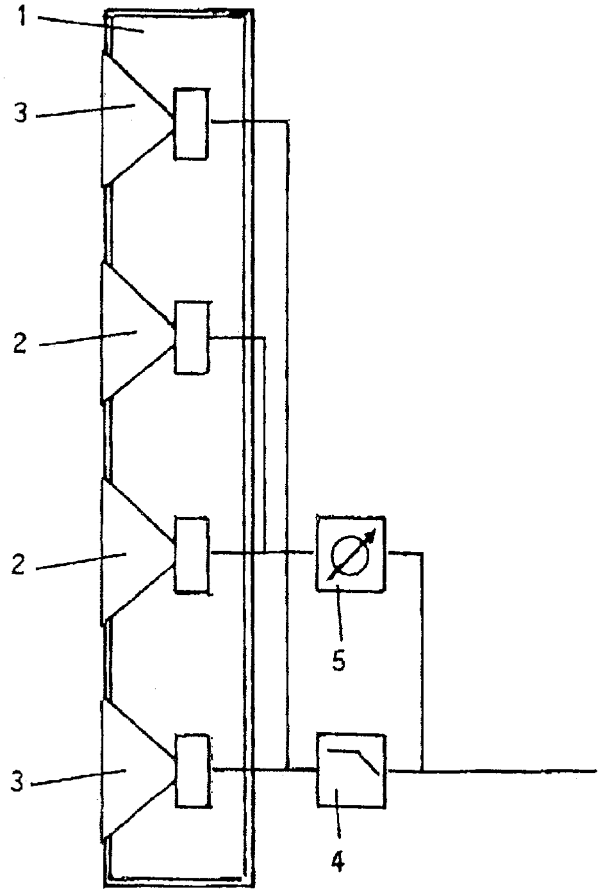

Therein depict:

FIG. 1 a basic circuit with two identically structured loudspeakers, operated with passive filters, FIG. 2 the basic circuit with two identically structured loudspeakers, operated with active filters, FIG. 3 a circuit with three identical loudspeakers operated with passive filters, FIG. 4 the circuit with three identical loudspeakers operated with active filters, FIG. 5 the base circuit expanded by an additional treble loudspeaker, FIG. 6 the basic circuit with the twofold loudspeaker number.

The loudspeaker combination according to the invention comprises in its basic circuit shown in FIGS. 1 and 2 two identically structured loudspeakers 2, 3 installed in a housing 1, of which the one loudspeaker 3 is preceded by a low-pass frequency filter 4. The other loudspeaker 2 is preceded by an all-pass filter 5 with phase shifter, which, with respect to its phase setting, is tuned to the phase position of the loudspeaker 3 provided for radiating low tones. Although both loudspeakers 2, 3 are of identical structural type and form and not built specifically, or only within limits, for radiating low frequencies and, in terms of their geometric forming, are well suited for radiating medium frequencies, in this combination, provided there is suitable phase adaptation of the all-pass filter 5, a better radiation result is attained than when utilizing different loudspeakers adapted to specific frequency ranges.

In the embodiment depicted in FIG. 2, to the passive structural components have been added amplifiers 6, 7 as active structural components.

In FIG. 3, relative to the basic circuit (FIG. 1), the loudspeaker combination is expanded by a further loudspeaker 8, also of a structural type and form identical to loudspeakers 2 and 3. In this combination, in which the loudspeaker 3, as in the basic circuit of FIG. 1, is preceded by a low-pass filter 4 and the loudspeaker 2 by an all-pass filter 5 with phase shifter, additionally, the all-pass filter 5 is preceded by a low-pass filter 9, which, however, relative to low-pass filter 4, has a higher upper pass frequency. The additional loudspeaker 8 is now preceded by two additional all-pass filters 10 and 11 with phase shifters. The all-pass filter 10 is tuned in its phase position to the low-pass filter 4 preceding loudspeaker 3, and the all-pass filter 11 is tuned to the low-pass filter 9 preceding loudspeaker 2, while the all-pass filter 5, as in the basic circuit, is tuned to the low-pass filter 4 in its phase position. Provided there is suitable phase adaptation of the all-pass filters 5, 10, 11, in this combination a better radiation result is attained than when utilizing different loudspeakers adapted to certain frequency ranges.

In this loudspeaker combination it is, for example, possible for the low-pass filter 4 to be laid out for an upper pass frequency of 250 Hz and the low-pass filter 9 for an upper pass frequency of 500 Hz.

The embodiment, depicted in FIG. 4 and equipped with active structural elements, of a loudspeaker combination with three identical loudspeakers is structured slightly differently from the embodiment shown in FIG. 3 with only passive structural elements.

The three loudspeakers 2, 3, 8 are each preceded by an amplifier 6, 7, 12 as the active element. The loudspeaker 3 with amplifier 7, as in the basic circuit, is only preceded by a low-pass filter 4, the loudspeaker 2 by a low-pass filter 9 and an all-pass filter 5 with phase shifter tuned, with respect to its phase position, to low-pass filter 4. Across a tap between the all-pass filter 5 and the low-pass filter 9 the loudspeaker 8 equipped with amplifier 6 is supplied, which is preceded by an all-pass filter 11. This is tuned to the low-pass filter 9, while the all-pass filter 5 is tuned to the low-pass filter 4.

In addition to the identically structured loudspeakers 2 and 3, in the embodiment of FIG. 5 is installed a treble loudspeaker 14 in housing 1. It is preceded by a high-pass filter 13, which, for examples passes frequencies higher than 2 kHz. Loudspeaker 3 is preceded by low-pass filter 4 with an upper pass frequency of, for example, 500 Hz, and this is preceded by a further low-pass filter 15 with an upper pass frequency of 2 kHz. Loudspeaker 2 is connected to all-pass filter 5 with phase shifter and it to a tap between the two low-pass filters 4 and 5.

FIG. 6 shows the basic circuit of FIG. 1 with the twofold loudspeaker number in housing 1, in which the loudspeakers radiating the basses are disposed on the outsides of the loudspeaker series.

As filters can also be employed such which digitally process signals and audio pulses of different frequencies.

LIST OF REFERENCE NUMBERS

1 Housing
2 Loudspeaker
3 Loudspeaker
4 Low-pass frequency filter
5 All-pass filter with phase shifter
6 Amplifier
7 Amplifier
8 Loudspeaker

9 Low-pass frequency filter
10 All-pass filter with phase shifter
11 All-pass filter with phase shifter
12 Amplifier
13 High-pass filter
14 Treble loudspeaker
15 Low-pass filter

The invention claimed is:

1. Loudspeaker combination, comprising at least two loudspeakers (2, 3), of which one (3) is preceded by a low-pass frequency filter (4) and the other (2) by a phase shifter (5), said at least two loudspeakers (2, 3), one including at least one loudspeaker (3) that radiates low frequency tones and at least one other (2) loudspeaker that radiates low and at least medium frequency tones, said phase shifter (5) in front of said at least one other loudspeaker (2) radiating low as well as medium frequency tones being set such that said phase shifter 5 causes the low frequency tones emanating from said at least one other loudspeaker (2) to have substantially the same phase as the low frequency tones emanating from said at least one loudspeaker (3), whereby said low frequency tones emanating from said loudspeakers are substantially in phase with each other and reinforce each other to increase the volumes of said low frequency tones, thereby allowing smaller-sized loudspeakers for a desired volume output.

2. Loudspeaker combination as claimed in claim 1, wherein said at least one other of the loudspeakers (2, 8) also radiating tones of the medium frequency range is similar and of the same structural type and form as said at least one loudspeaker (3) with a preceding low-pass filter (4).

3. Loudspeaker combination as claimed in claim 1, wherein at least several of said loudspeakers (2, 3, 8) standing alone have identical or at least highly similar frequency characteristics.

4. Loudspeaker combination as claimed in claim 1, wherein at least several of said loudspeakers (2, 3, 8) of identical structural type and form.

5. Loudspeaker combination as claimed in claim 1, wherein said loudspeaker combination in its base form comprises two loudspeakers (2, 3), of which the one (3) is only preceded by a low-pass frequency filter (4), such that it only radiates tones in the bass frequency range, and the other loudspeaker (2) is preceded by a phase shifter (5) alone, such that it radiates tones of the medium as well as also of the low frequency tone ranges, said loudspeaker (2) radiating tones of the low as well as also of the medium frequency tone ranges, in being adjusted to set the phase setting of its bass frequency range to substantially correspond to the base frequency range of said bass loudspeaker (3).

6. Loudspeaker combination as claimed in claim 1, wherein said phase shifter (5) is an all-pass filter with a phase shifting element.

7. Loudspeaker combination as claimed in claim 1, further comprising at least one treble loudspeaker (14) with a preceding high-pass filter 36 is provided in this loudspeaker combination.

8. Loudspeaker combination as claimed in claim 1, wherein two loudspeakers are provided, both loudspeakers radiating low frequency tones, and being of identical structural type and form, that the one loudspeaker radiates only low frequency tones, the other loudspeaker at least low frequency tones and medium frequency tones, and that both loudspeakers are set to to create low tones of substantially the same phase.

9. Loudspeaker combination comprising at least two loudspeakers (2,3), of which one (3) is preceded by a low-pass frequency filter (4) and the other (2) by a phase shifter (5), said at least two loudspeakers (2,3) including at least one loudspeaker (3) that radiates low frequency tones and at least one other (2) loudspeaker that radiates low and at least medium frequency tones, said phase shifter (5) in front of said at least one other loudspeaker (2) radiating low as well as medium frequency tones being set such that said phase shifter (5) is set to be tuned to the phase position of said at least one loudspeaker (3) radiating only lower frequency tones, wherein said at least one loudspeaker (3) is preceded by a low-pass filter (4) and the said at least one other loudspeaker (2) by an all-pass filter (5) with a phase shifter, a further additional loudspeaker (8), radiating, in addition to tones of medium frequency, also tones of the bass frequency range, with a preceding all-pass filter (10) and in addition to the all-pass filter (5) preceding the loudspeaker (2), a low-pass filter (9) precedes it, which, however, relative to the low-pass filter (4), has a higher upper pass frequency, said additional loudspeaker (8), in addition to the all-pass filter (10), is preceded by a further all-pass (11) with phase shifter, said all-pass filter (10) in its phase position being tuned to low-pass filter (4) preceding the said at least one loudspeaker (3) and the other all-pass filter (11) to the low-pass filter (9) preceding the loudspeaker (2), while said all-pass filter (5), is tuned to the low-pass filter (4) in its phase position.

10. Loudspeaker combination, comprising at least two loudspeakers (2,3), of which one (3) is preceded by a low-pass frequency filter (4) and the other (2) by a phase shifter (5), said at least two loudspeakers (2,3) including at least one loudspeaker (3) that radiates low frequency tones and at least one other (2) loudspeaker that radiates low and at least medium frequency tones, said phase shifter (5) in front of said at least one other loudspeaker (2) radiating low as well as medium frequency tones being set such that said phase shifter (5) is set to be tuned to the phase position of said at least one loudspeaker (3) radiating only lower frequency tones, wherein said loudspeakers (2, 3) of this loudspeaker combination are preceded by amplifiers (7, 12) as active circuit elements, said at least one loudspeaker (3) with amplifier (7) is only preceded by a low-pass filter (4), said at least one other loudspeaker (2) by a low-pass filter (9) and an all-pass filter (5) with phase shifter tuned in its phase position to the low-pass filter (4), that across a tap between the all-pass filter (5) and the low-pass filter (9) a loudspeaker (8) is equipped with an amplifier (6), which is preceded by an all-pass filter (11) tuned to said low-pass filter (9), while said all-pass filter (5) is tuned to the said low-pass filter (4).

* * * * *